(12) United States Patent
Arao et al.

(10) Patent No.: US 7,534,702 B2
(45) Date of Patent: May 19, 2009

(54) METHOD FOR MANUFACTURING A SEMICONDUCTOR DEVICE

(75) Inventors: Tatsuya Arao, Kanagawa (JP); Yoshitaka Dozen, Kanagawa (JP); Daiki Yamada, Kanagawa (JP); Eiji Sugiyama, Kanagawa (JP); Tomoko Tamura, Kanagawa (JP); Junya Maruyama, Kanagawa (JP); Nozomi Horikoshi, Kanagawa (JP); Yuugo Goto, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 412 days.

(21) Appl. No.: 11/157,166

(22) Filed: Jun. 21, 2005

(65) Prior Publication Data

US 2005/0285231 A1 Dec. 29, 2005

(30) Foreign Application Priority Data

Jun. 29, 2004 (JP) ............................. 2004-192117

(51) Int. Cl.
*H01L 21/00* (2006.01)
(52) U.S. Cl. ..................... 438/464; 438/110; 438/458
(58) Field of Classification Search ................. 438/460, 438/462, 464, 110, 458, 739, 33, 68, 113, 438/114, 598, FOR. 118, FOR. 123, FOR. 365; 257/E21.556, E21.526
See application file for complete search history.

(56) References Cited

U.S. PATENT DOCUMENTS

| | | | |
|---|---|---|---|
| 5,757,456 A | 5/1998 | Yamazaki et al. | |
| 5,821,138 A | 10/1998 | Yamazaki et al. | |
| 6,118,502 A | 9/2000 | Yamazaki et al. | |
| 6,204,079 B1 * | 3/2001 | Aspar et al. | 438/25 |
| 6,376,333 B1 * | 4/2002 | Yamazaki et al. | 438/458 |
| 6,514,795 B1 * | 2/2003 | Jiang et al. | 438/113 |
| 6,713,851 B1 * | 3/2004 | Umehara et al. | 257/675 |
| 6,797,544 B2 * | 9/2004 | Sakai et al. | 438/121 |
| 6,979,593 B2 * | 12/2005 | Kawakami | 438/110 |
| 7,091,109 B2 * | 8/2006 | Fujii et al. | 438/464 |
| 7,183,639 B2 * | 2/2007 | Mihara et al. | 257/690 |
| 7,352,040 B2 * | 4/2008 | Partridge et al. | 257/419 |
| 7,452,786 B2 * | 11/2008 | Dozen et al. | 438/458 |
| 2001/0015256 A1 * | 8/2001 | Yamazaki et al. | 156/289 |
| 2003/0022403 A1 * | 1/2003 | Shimoda et al. | 438/14 |

(Continued)

FOREIGN PATENT DOCUMENTS

JP 08-250745 9/1996

(Continued)

*Primary Examiner*—Matthew Smith
*Assistant Examiner*—Joseph C Nicely
(74) *Attorney, Agent, or Firm*—Fish & Richardson P.C.

(57) ABSTRACT

An efficient mass-production method of very small devices that can receive or transmit data in touch, preferably, out of touch is provided by forming an integrated circuit made of a thin film over a large glass substrate and transferring the integrated circuit to another backing to be divided. Especially, the integrated circuit made of a thin film is difficult to use since there is a threat that the integrated circuit is scattered in the handling of the integrated circuit since the integrated circuit is extremely thin. According to the present invention, multiple openings reaching a peel layer are provided, a material body having a pattern shape that does not cover regions (the openings and a device portion) is provided, and then, a gas or liquid containing fluorine halide is introduced to partially remove the peel layer.

19 Claims, 11 Drawing Sheets

U.S. PATENT DOCUMENTS

| | | | |
|---|---|---|---|
| 2003/0157783 A1* | 8/2003 | Fonash et al. | 438/458 |
| 2004/0235267 A1* | 11/2004 | Sheats et al. | 438/455 |
| 2005/0070038 A1 | 3/2005 | Yamazaki et al. | |
| 2006/0121694 A1* | 6/2006 | Tamura | 438/458 |
| 2006/0270191 A1* | 11/2006 | Tamura et al. | 438/458 |
| 2007/0166954 A1* | 7/2007 | Yamazaki et al. | 438/452 |
| 2007/0196999 A1* | 8/2007 | Tamura et al. | 438/458 |

FOREIGN PATENT DOCUMENTS

| | | |
|---|---|---|
| JP | 08-288522 | 11/1996 |
| JP | 2003/158414 | 5/2003 |
| WO | WO 2005/057658 A1 * | 6/2005 |

* cited by examiner

METHOD FOR MANUFACTURING A SEMICONDUCTOR DEVICE

BACKGROUND OF THE INVENTION

1. Field of the Invention

The present invention relates to a method for peeling a circuit or a semiconductor device that is composed of thin film transistors (hereinafter, TFTs), and a semiconductor device that is obtained by the method.

As used herein, the term "semiconductor device" refers to devices in general that operates by utilizing semiconductor characteristics. Each of an electro-optical device, a semiconductor circuit, and an electronic appliance is a semiconductor device.

2. Related Art

Technique for forming a TFT by using a semiconductor thin film (with a thickness of approximately from several to several hundreds nm) formed over a substrate having an insulating surface has attracted attention recently. The TFT has been widely applied to electronic devices such as an IC or an electro-optical device, and has been accelerated to be developed as a switching element of an image display device.

Various applications of an image display device have been expected. Especially, the image display device application for a cellular phone has attracted attention. Currently, a glass substrate or a quartz substrate are widely used, however, they have defects of being fragile and heavy. Hence, it has been tested that a TFT element is formed over a substrate having flexibility, typically, a flexible plastic film.

However, maximum process temperature should be lowered since the heat resistance of the plastic film is poor. As a result, the TFT formed over the plastic film cannot have so much excellent electric characteristics as that of a TFT formed over a glass substrate in the present situation. Therefore, a high-performance semiconductor element using a plastic film has not been realized.

Consequently, a technique of peeling an element formed over a glass substrate from a substrate and transferring the element to another backing such as a plastic film is proposed.

The applicants propose peeling or transferring technique as disclosed in the following patent documents 1 or 2.

In the case of a very small device such as an IC, a semiconductor wafer is pasted onto an adhesive sheet to be divided as a chip unit, and the divided semiconductor element is picked up from the adhesive sheet, then, the picked up semiconductor element is mounted in a circuit substrate constituting an IC card or the like. Since the semiconductor wafer is used, the IC had defects of being subjected to be injured or broken when being picked up.

Patent document 1: Unexamined patent publication No. Hei 8-288522

Patent document 2: Unexamined patent publication No. Hei 8-250745

It has been recently considered the possibility of utilizing "noncontact IC tag" (generally, referred to as noncontact data carrier) that can record and read out information out of touch for information management of goods or products, physical distribution management, and the like.

A semiconductor wafer that serves as a mother body for a semiconductor chip used for an IC card or a noncontact IC tag is expensive and unfit for mass-production.

A method for manufacturing the matrix type (multiple patterned type) that is mounted with multiple electronic component elements over a glass substrate and divided into individual pieces as a product has been distributed. A small device is preferably manufactured over a large substrate in consideration for mass-production.

SUMMARY OF THE INVENTION

In view of the foregoing, an efficient mass-production method of very small devices that can receive or transmit data in touch, preferably, out of touch by forming an integrated circuit made of a thin film over a large glass substrate and transferring the integrated circuit to another backing to be divided. Especially, the integrated circuit made of a thin film is difficult to use since there is a threat that the integrated circuit is scattered in the handling of the integrated circuit since the integrated circuit is extremely thin.

The inventors discovered that a portion of a peel layer overlapped with a region where a material body is provided is not removed (or difficult to be removed) when a peel layer of amorphous silicon or polysilicon is formed over a glass substrate, and a device portion such as a semiconductor element is provided over the peel layer, then, a material body (typically, resin) is partially provided.

Specifically, openings (typically, multiple holes or grooves) reaching the peel layer are provided, and a material body having a pattern shape that does not cover the openings and the device portion is provided, then, gas or liquid containing fluorine halide is introduced, and then, the peel layer can be selectively removed. The inventors discovered that irregularities over the peel layer have effect on etching, and so the material body is formed to have a convex shape in a region which should be fixed to the portion of the peel layer. By providing a material body having a thickness of 1 µm or more, an introduction path of gas or liquid containing fluorine halide is changed, which leads to change the way of etching. Consequently, a peel layer in the region where the material body is provided is retained.

By retaining the peel layer in the predetermined region, only a device portion can be transferred to another backing in the state of being fixated partially to the glass substrate.

One embodiment of the present invention provides a method for manufacturing a semiconductor device comprising the steps of forming a peel layer over a substrate having an insulating surface; forming a layer including at least first and second portions over the peel layer; forming at least one opening reaching the peel layer in the layer including first and second portions; forming a material body between the first portion and the second portion; introducing an etching material in the opening; selectively removing the peel layer by the etching material wherein a portion of the peel layer remains without being etched, and the material body overlaps said portion; and separating the first portion and the second portion from the substrate having the insulating surface.

In the foregoing embodiment, the first and second portions each have at least one semiconductor element.

In the foregoing embodiment, the etching material is gas or liquid containing fluorine halide.

In the foregoing embodiment, the opening is one or a plurality of a hole.

In the foregoing embodiment, the opening is one or a plurality of a groove.

Another embodiment of the present invention provides a method for manufacturing a semiconductor device comprising the steps of forming a peel layer over a substrate having an insulating surface; forming a layer including a plurality of thin film integrated circuits over the peel layer; forming multiple holes or grooves reaching the peel layer in the layer including a plurality of thin film integrated circuits; forming a material body over at least a part of a boundary between neighboring thin film integrated circuits; introducing gas or liquid containing fluorine halide in the multiple holes or grooves; removing selectively the peel layer and retaining a part of the peel layer at only a bottom of the material body; and separating the thin film integrated circuits on each piece basis or on each group basis from the substrate having the insulating surface.

Alternatively, the thin film integrated circuits can be divided after being transferred to a backing having an adhesion surface. Another embodiment of the present invention provides a method for manufacturing a semiconductor device comprising the steps of forming a peel layer over a substrate having an insulating surface; forming a layer including a plurality of thin film integrated circuits over the peel layer; forming multiple holes or grooves reaching the peel layer in the layer including a plurality of thin film integrated circuits; forming a material body over at least a part of a boundary between neighboring thin film integrated circuits; introducing gas or liquid containing fluorine halide in the multiple holes or grooves; removing selectively the peel layer and retaining a part of the peel layer at only a bottom of the material body; transferring the thin film integrated circuits to a backing having an adhesion surface; and dividing the thin film integrated circuits into individual pieces or individual groups.

In the foregoing embodiment, a top surface shape of the material body is a linear shape parallel to one side of the substrate or a lattice shape surrounding the thin film integrated circuits. Further, the holes are not required to be formed in a region where the material body is provided. In the foregoing each embodiment, the material body is obtained by a screen printing method or a droplet discharging method. The process is simplified by forming the material body without a photomask. A screen printing method or a droplet discharging method have no effect on an element due to solvent or a reaction gas by etching, and so these methods are preferably used.

The material body is preferably a material that does not chemically react with the gas or liquid containing fluorine halide. For example, epoxy resin or PTFE (TEFLON®) resin can be used as the material body.

In the conventional technique, a semiconductor element is formed over a peel layer that is formed over a glass substrate, and the semiconductor element is bonded to a substrate for fixating to be peeled from the glass substrate. In the present invention, a glass substrate is continuously used as a substrate for fixating, which can prevent small sized integrated circuits from being scattered in a peeling process or a transferring process. According to the present invention, small devices can be manufactured over a large substrate, and the devices can be easily handled as individuals.

According to the present invention, when the gas or liquid containing fluorine halide is introduced, voids are formed The voids are formed by removing partially the peel layer.

Laminating by performing heat sealing after introducing the gas or liquid containing fluorine halide can realize further reduction of a thickness of a semiconductor chip.

The semiconductor device obtained from the foregoing manufacturing method is one aspect of the present invention. More another embodiment of the present invention provides a semiconductor device that is sealed with a first film and a second film, comprising a first insulating film, a layer including a semiconductor element over the first insulating film, and a second insulating film covering the layer including a semiconductor element, between the first film and the second film; wherein the first film is in contact with the first insulating film and the second film is in contact with the second insulating film.

The device may have a communication function. Still more another embodiment of the present invention provides a semiconductor device that is sealed with a first film and a second film, comprising a first insulating film, a layer including a semiconductor element and an antenna over the first insulating film, and a second insulating film covering the layer including a semiconductor element and an antenna over the first insulating film, between the first film and the second film; wherein the first film is in contact with the first insulating film and the second film is in contact with the second insulating film.

In the foregoing each structure, the insulating film in the layer including the semiconductor element and the antenna has multiple holes or grooves in the region that is not overlapped with the semiconductor element and the antenna. The multiple holes or grooves reach the first film and the second film. The multiple holes or grooves are formed when peeling the layer including the semiconductor element and the antenna from the glass substrate.

In the case that the antenna is made from a material that can resist the gas or liquid containing fluorine halide, for example, a material containing aluminum as its main component, the antenna is not required to be covered by the second insulating film. Still further more another embodiment of the present invention provides a semiconductor device that is sealed with a first film and a second film, comprising a first insulating film, a layer including a semiconductor element over the first insulating film, and an antenna over the layer including a semiconductor element, between the first film and the second film; wherein the first film is in contact with the first insulating film and the second film is in contact with the antenna.

In the foregoing each structure, the first film or the second film is a laminate film. By using the laminate film, a process of forming an adhesion layer for pasting a film can be omitted. An anchor coat layer can be provided between the laminate film and the first insulating film to improve adhesiveness. Further, an anchor coat layer can be provided between the laminated film and the second insulating film to improve adhesiveness.

The laminate film is a laminate film formed by a backing film and an adhesive synthetic resin film or a laminate film formed by two or more kinds of layers. As the backing film, polyester such as PET or PBT, polyamide such as nylon 6 or nylon 66, an inorganic deposited film, or papers may be used. As an adhesive synthetic resin film, polyolefin such as PE or PP, acrylic synthetic resin, epoxy synthetic resin, or the like may be used. As pretreatment for a laminate process, an anchor coat agent is preferably coated, which can strengthen the adhesiveness of the laminate film and a subject. As the anchor coat agent, isocyanate or the like may be used.

As used herein, the term "heat sealing" refers to sealing by thermocompression. More specifically, an adhesion agent layer that is part coated to a film backing, or the outermost coat layer or the innermost coat layer having a low melting point of the laminate film is melted by applying heat and bonded by applying pressure.

The first insulating film is an inorganic insulating film containing silicon nitride or silicon oxide as its main component. A laminated TFT is formed by using the inorganic insulating film containing silicon nitride or silicon oxide as its main component as a base film.

The present invention can be applied regardless of the TFT structure, for example, a top gate TFT, a bottom gate TFT (reversely staggered TFT), or a staggered TFT can be used.

Not only a single gate TFT, but also a multi gate TFT having a plurality of channel formation region, for example, a double gate TFT can be used.

As the active layer of the TFT, an amorphous semiconductor film, a semiconductor film including a crystalline structure, a compound semiconductor film including an amorphous structure, or the like can be appropriately used. Further, a semiamorphous semiconductor film (also referred to as a microcrystalline semiconductor film) that has an intermediate structure of an amorphous structure and a crystalline structure (including a single crystal and a poly crystal), the third state that is free-energetically stable, and a crystalline region having a short-distance order and a lattice distortion can be used as the active layer of the TFT.

By providing a region where the substrate and a part of the remaining peel layer are bonded to each other even after removing the peel layer, the thin film integrated circuits provided above the insulating film can be prevented from being scattered. Since the thin film integrated circuits can be kept over the substrate by providing the region where a part of the peel layer is retained, the thin film integrated circuits can be easily transferred to a backing.

In accordance with the present invention, in the case that the thin film integrated circuits are kept over the substrate, the substrate can be directly transported, and so the present invention can be used for a mass-production device including a transporting means. For example, when the substrate held with the thin film integrated circuits is transported to a laminate device, a laminate process of the thin film integrated circuits can be continuously carried out.

These and other objects, features and advantages of the present invention will become more apparent upon reading of the following detailed description along with the accompanied drawings.

DESCRIPTION OF THE INVENTION

Hereinafter, embodiments of the present invention will be explained.

Embodiments according to the present invention are explained with reference to FIGS. 1A to 4D in detail. Through the drawings of the embodiments, like components are denoted by like numerals as of these embodiments with each other and will not be further explained.

EMBODIMENT 1

A method for manufacturing a semiconductor device according to the present invention will be explained hereinafter.

A peel layer 11a is formed over a substrate having an insulating surface 10. The substrate having an insulating surface 10 represents a glass substrate, a quartz substrate, a plastic substrate, a resin substrate made from synthesized resin having flexibility such as acrylic, or a metal substrate. The peel layer 11a is formed by forming a layer containing silicon by a known method such as a sputtering method or a plasma CVD method. The layer containing silicon represents an amorphous semiconductor layer, a semiamorphous semiconductor layer of mixed amorphous and crystal states or a crystalline semiconductor layer.

An insulating film 12a is made of an inorganic insulating film. The insulating film 12a is formed by forming a single layered film made from silicon oxide, silicon nitride, silicon oxynitride, silicon nitride oxide, or the like, or a laminated layered film made from the foregoing materials by a known method such as a sputtering method or a plasma CVD method.

Figure 1A:
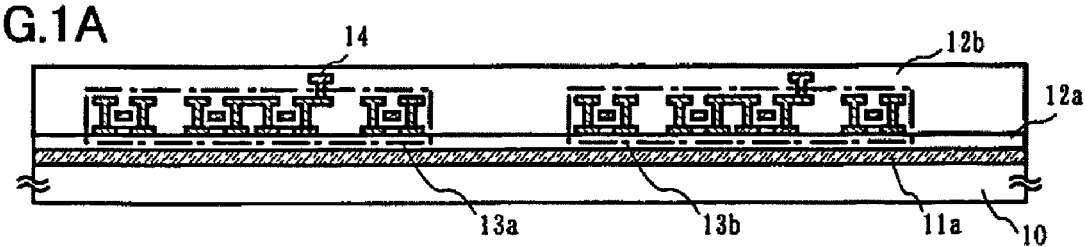
FIGS. 1A to 1E are explanatory cross-sectional views of a method for manufacturing a thin film integrated circuit according to the present invention.

A layer including a semiconductor element 12b is formed using the insulating film 12a as a base film (FIG. 1A). Although FIG. 1A illustrates an example of showing a first element group 13a and a second element group 13b that is adjacent to the first element group 13a, the present invention is not limited thereto. The substrate 10 is provided with multiple element groups, which are divided lastly into products as individuals. Further, the first element group 13a includes a plurality of TFTs and a conductive layer 14 serving as an antenna. The first element group 13a ends up being one device.

Figure 1B:
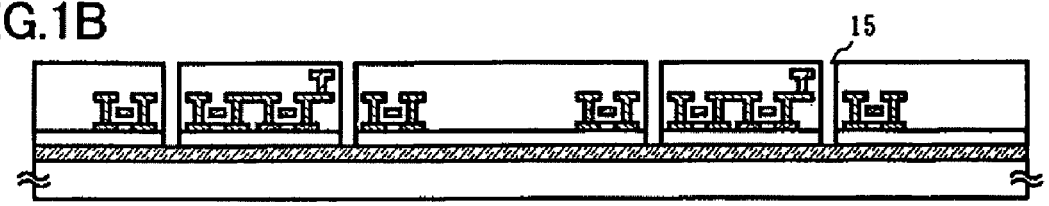

Then, an etching process is carried out using a mask. By the etching process, an opening portion 15 reaching the peel layer 11a is selectively formed except in a region where the TFTs or the conductive layer 14 are formed to expose the peel layer 11a (FIG. 1B). Further, the arrangement of the opening portion 15 is not especially limited as long as the opening portion 15 is formed except in the region where the TFTs or the conductive layer 14 are formed, and can be formed in an appropriate region. Further, the opening portion 15 may be a hole or groove having a width.

Figure 1C:
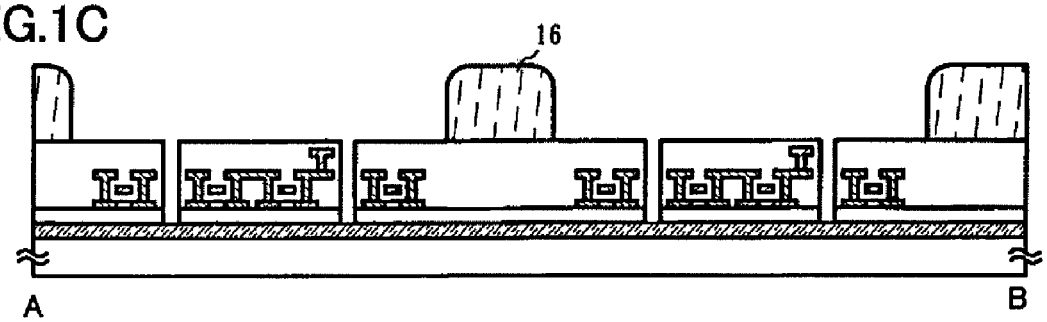
Figure 3:
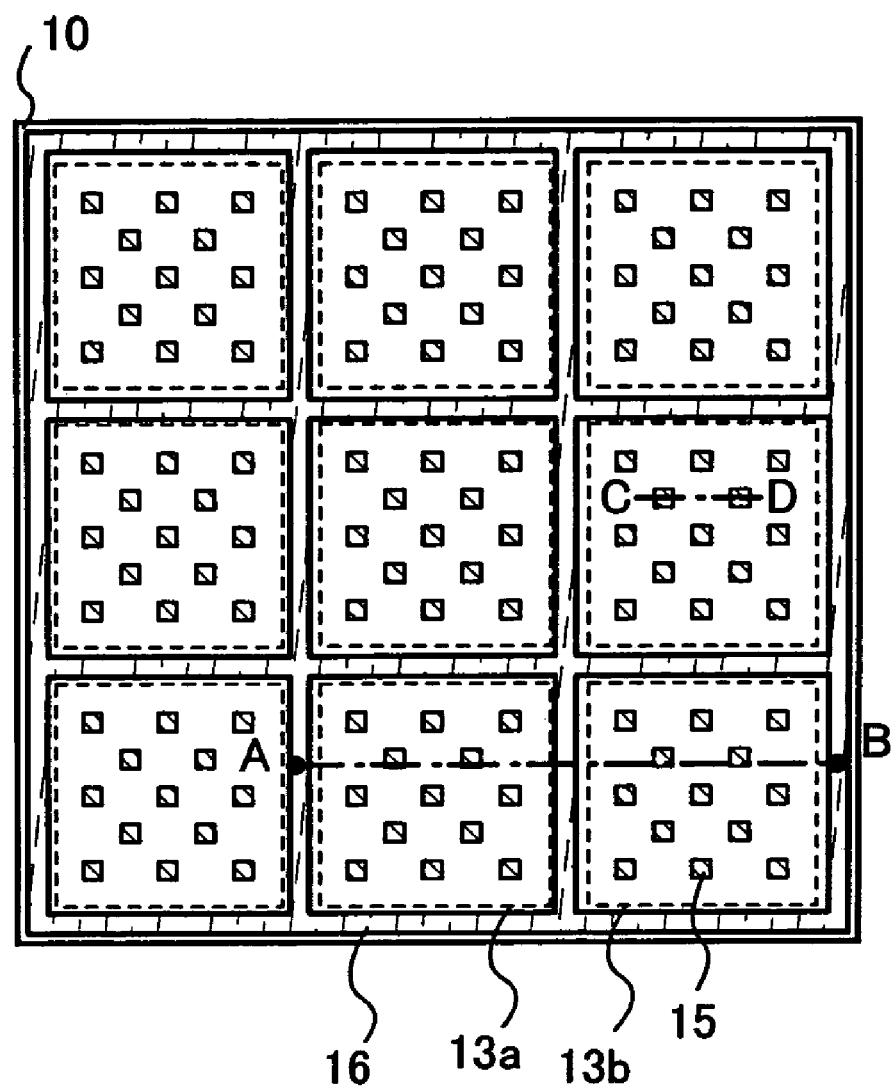
FIG. 3 is a top view of an explanatory cross-sectional view of a method for manufacturing a thin film integrated circuit according to the present invention.

And then, a material body 16 is formed by a screen printing method or a droplet discharging method (FIG. 1C). Alternatively, the material body 16 is formed by using a dispenser device. FIG. 3 is a top view at this stage of the manufacturing process. The material body 16 may be formed over a region that is desired to retain the peel layer 11a. For example, the material body 16 is formed into a lattice shape that surrounds one element group as shown in an example of the top view in FIG. 3. FIG. 1C is a cross-sectional view of FIG. 3 taken along a dashed line A-B. The material body is preferably a material that is not chemically reactive with gas or liquid containing halide fluorine. The material body 16 is formed into a lattice shape using epoxy resin by a screen printing method.

Figure 5:
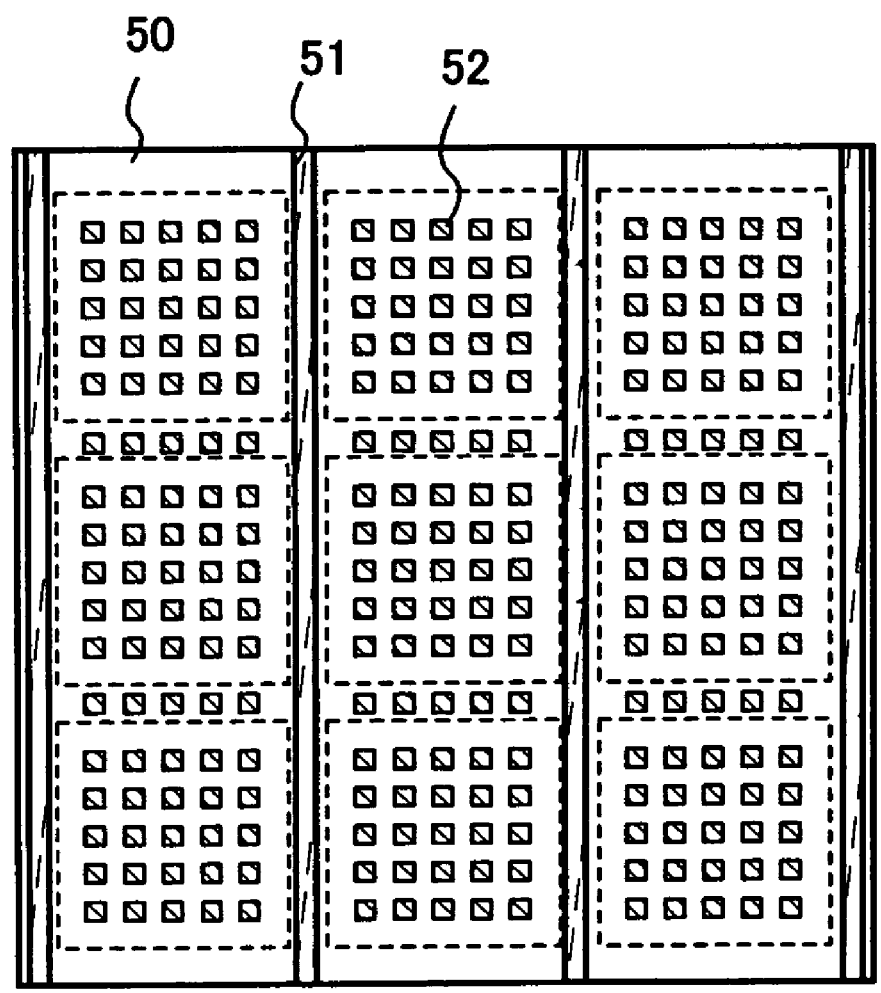
FIG. 5 is a top view of an explanatory cross-sectional view of a method for manufacturing a thin film integrated circuit according to the present invention.

The pattern of the material body 16 is not especially limited. As shown in FIG. 5, the pattern of a material body 51 may be formed into a linear shape parallel to one side of a substrate 50. In the case of forming the linear shape, an ink jetting method is preferably used. It is difficult for the ink jetting method to form a crossing portion when forming the lattice shape. In FIG. 5, a hole 52 can also be provided between element groups. In case that the pattern of the material body is formed into that shown in FIG. 5, it is preferably bonded to another substrate with an adhesion layer or laminate with a laminated film along with the pattern of the material body 51.

Figure 1D:
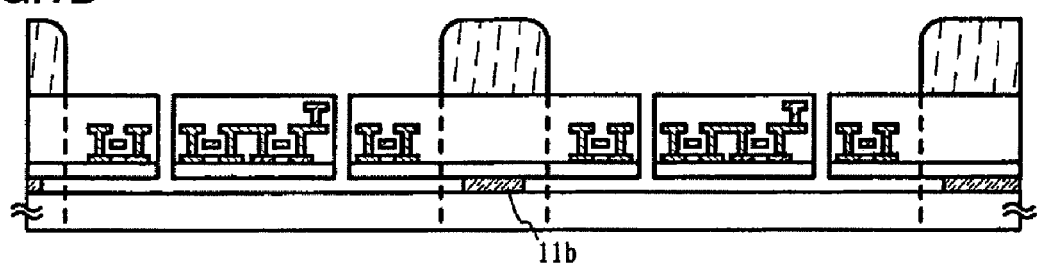

An etching agent for removing the peel layer is introduced to the opening portion to remove partially the peel layer and to retain a peel layer 11b in a region overlapped with the material body (FIG. 1D). As the etching agent, gas or liquid containing fluorine halide is used. As the gas containing fluorine halide, for example, trifluoride chlorine ($ClF_3$) is used. By providing the material body 16, the etching agent becomes difficult to be introduced into the opening portion, which leads to retain the peel layer 11b in the region that is overlapped with the material body 16. Although FIG. 1D illustrates that the width of the peel layer 11b is narrower than the pattern width of the material body, the present invention is not limited thereto. The width of the remaining peel layer 11b can be increased so that both of the peel layer 11b width and the pattern width of the material body are identical to each other or that the peel layer 11b width is not overlapped with the element group.

Figure 1E:
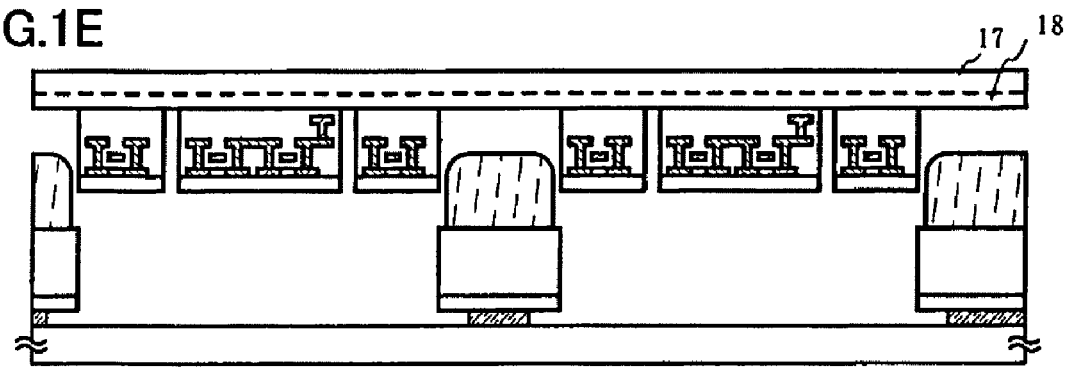

The first element group 13a and the second element group 13b are thermocompressed to a laminate film formed by a first adhesive synthetic resin film 18 and a first backing film 17 by a laminate method to peel the first element group 13a and the second element group 13b from the substrate 10 (FIG. 1E). A laminate film having a total thickness of 15 to 200 μm is used in terms of strength, processing workability, costs, and the like. Here, a laminate film (with a total thickness of 60 μm) formed by stacking polyethylene (20 μm) and a polyethylene film (40 μm) is used as the laminate film.

In thermocompression, heating temperature and pressure are preferably set so that an element included in the element group is not destroyed, more preferably, set so that element characteristics are not varied. Further, there is an effect that the material body 16 can concentrate pressure on the material body 16 itself to prevent the concentration of pressure on the element group during thermocompression.

In the case that the material body 16 has good adhesiveness to the first adhesive synthetic resin film 18, the material body 16 maybe peeled from the substrate. In that case, the material body 16 can be removed in the subsequent process. In the case that the material body 16 is peeled from the substrate, the material body is separated from the insulating film in an interface therebetween. In the case that the material body 16 is peeled from the substrate, the insulating film overlapping with the material body is fixed in the form of sticking the lamination layers (without the material body) to each other since the remaining peel layer is presented. To save a process for removing the material body, the material body 16 has preferably poor adhesiveness to the first adhesive synthetic resin film 18. In the case that the material body 16 has poor adhesiveness to the first adhesive synthetic resin film 18, the portion that is not provided with the peel layer is bonded to the first backing film 17 and completely peeled from the substrate 10, and the portion that is provided with the peel layer 11b remains over the substrate 10.

Instead of the laminate film formed by the first adhesive synthetic resin film 18 and the first backing film 17, a backing including an adhesion layer can be used.

Figure 2A:
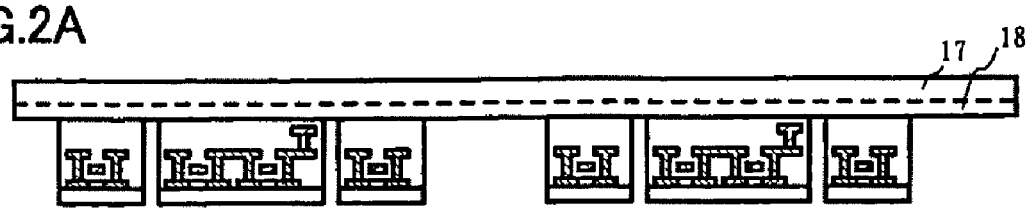
FIGS. 2A to 2C are explanatory cross-sectional views of a method for manufacturing a thin film integrated circuit according to the present invention.

At this step, as shown in FIG. 2A, the state that the first element group 13a and the second element group 13b adhere to the laminate film formed by the first adhesive synthetic resin film 18 and the first backing film 17 can be obtained.

Figure 2B:
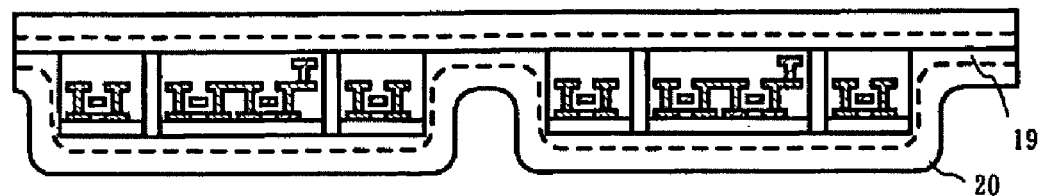

A sealing process is carried out by thermocompressing (at approximately 100° C.) the first element group 13a and the second element group 13b to a laminate film formed by a second adhesive synthetic resin film 19 and a second backing film 20 by a laminate method (FIG. 2B). Here, a laminate film (with a total thickness of 60 μm) formed by polyethylene (20 μm) and a polyethylene film (40 μm) is also used. In this embodiment, an example of sealing process with two laminate films of one kind is illustrated. However, the present invention is not limited to the example. Two laminate films of different kinds can be used for the sealing process.

Instead of the laminate film formed by the second adhesive synthetic resin film 19 and the second backing film 20, a backing including an adhesion layer can be used.

Figure 2C:
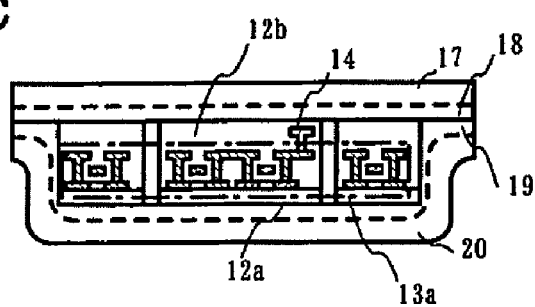

Lastly, the semiconductor device is divided into the individual pieces as shown in FIG. 2C. The laminate film is directly contacted with the first element group. Another material layer is not interposed between the laminate film and the first element group. Consequently, a semiconductor device having an extremely thin thickness (with a total thickness given by the thickness of the first element group (3 μm or less)+120 μm) sandwiched between two laminate films (60 μm) can be provided. Although FIG. 2C illustrates that the laminate film is bended, the two laminate films pasted with each other are almost plane practically since the laminated film has a thickness of 60 μm, whereas the first element group has a thickness of 3 μm or less.

Although an example of forming the material body 16 after forming the opening portion 15 is shown, the present invention is not limited thereto. The opening portion 15 can be formed after forming the material body 16.

EMBODIMENT 2

Figure 4A:
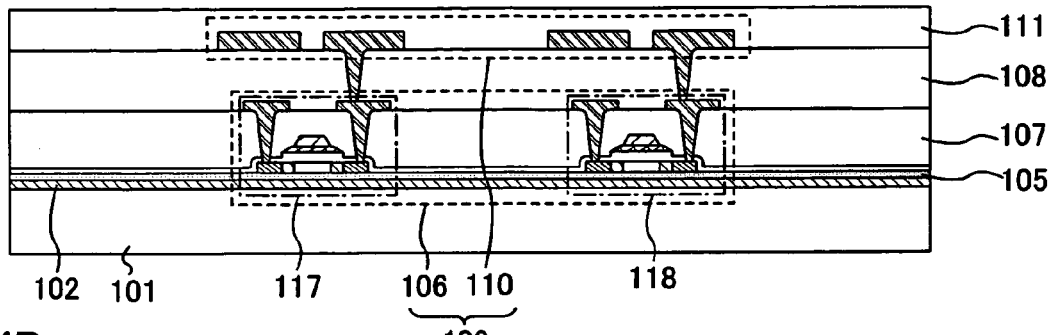
FIGS. 4A to 4D are explanatory cross-sectional views of a method for manufacturing a thin film integrated circuit according to the present invention.
Figure 4B:
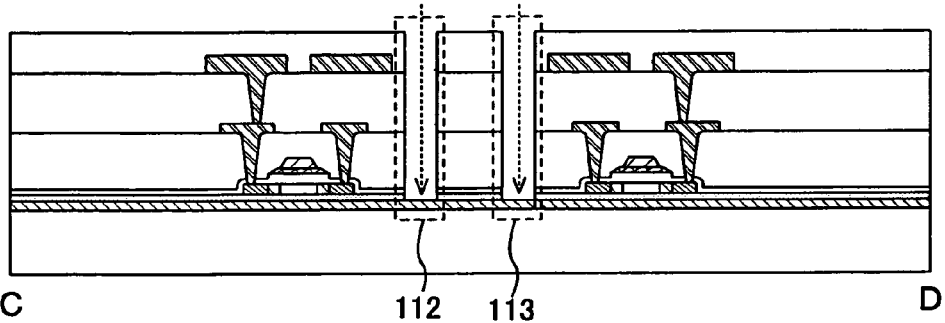

In Embodiment 2, more detail description than that given in Embodiment 1 will be given. A method for manufacturing a semiconductor device is explained with reference to FIGS. 4A to 4D. FIG. 4B is a cross-sectional view of FIG. 3 taken along a dashed line C-D explained in Embodiment 1.

A peel layer 102 is formed over a surface of a substrate 101 having an insulating surface.

An insulating film 105 as a base film is formed on the peel layer 102. The insulating film 105 is formed by a thin film made from silicon oxide, silicon nitride, silicon oxynitride, silicon nitride oxide, or the like by a known method such as a plasma CVD method or a sputtering method.

An element group 106 including a plurality of elements is formed over the insulating film 105. As the element group 106, for example, one or a plurality of a thin film transistor, a resistance element, a capacitor element, a diode, and the like is formed. An element group provided with a small light emission region or a display region can be provided by providing a light-emitting element connecting to the thin film transistor. A protective circuit (protective diode or the like) for preventing damages by electrostatic discharge can be provided to the element group 106. As the element group 106, two transistors 117, 118 are formed. Then, an insulating film 107 is formed so as to cover the element group 106, and then, an insulating film 108 is formed over the insulating film 107. A conductive layer 110 serving as an antenna is formed over the insulating film 108 by a sputtering method and a patterning process, or by a droplet discharging method.

An insulating film 111 serving as a protective film is formed over the conductive layer 110. Through the foregoing processes, a thin film integrated circuit 109 including the element group 106 and the conductive layer 110 is completed (FIG. 4A).

The insulating films 107, 108, and 111 are made from an organic material or an inorganic material. As the organic material, polyimide, acrylic, polyamide, siloxane, epoxy, or the like is used. The siloxane is composed of a skeleton formed by the bond of silicon (Si) and oxygen (O) in which an organic group containing at least hydrogen (such as an alkyl group or aromatic hydrocarbon) is included as a substituent. Alternatively, a fluoro group may be used as the substituent. Further alternatively, a fluoro group and an organic group containing at least hydrogen may be used as the substituent. Further, silicon oxide, silicon nitride, silicon oxynitride, silicon nitride oxide, or the like is used as the inorganic material.

Opening portions 112, 113 that are holes or grooves are selectively formed except in a region provided with the element and the conductive layer 110 to expose the peel layer 102 (FIG. 4B). That is, the opening portions 112, 113 are selectively provided to the periphery of the region where the element and the conductive layer 110 are formed. The opening portion is formed by etching, dicing, or the like with a mask.

A material body is formed by a screen printing method or a droplet discharging method. The material body may be formed in a region desired to retain the peel layer, for example, the boundary with the neighboring thin film integrated circuits.

Figure 4C:
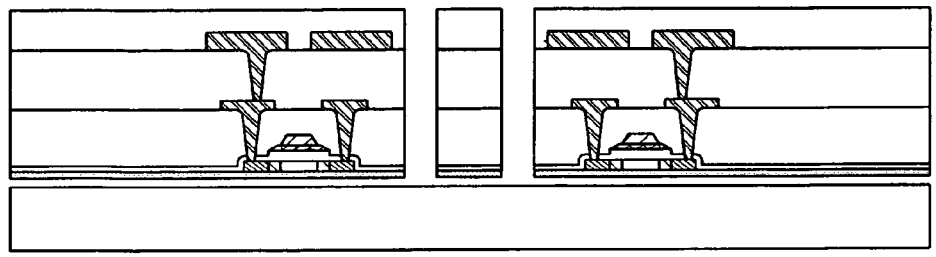

An etching agent for removing the peel layer 102 is introduced into the opening portions to remove partially the peel layer 102 (FIG. 4C). Although FIG. 4C illustrates that there is a void between the substrate 101 and the insulating film 105, the peel layer remains in a region provided with the material body and the thin film integrated circuit 109 is attached to the substrate 101. As the etching agent, gas or liquid containing fluorine halide is used. As the gas containing fluorine halide, for example, trifluoride chlorine ($ClF_3$) is used.

Figure 4D:
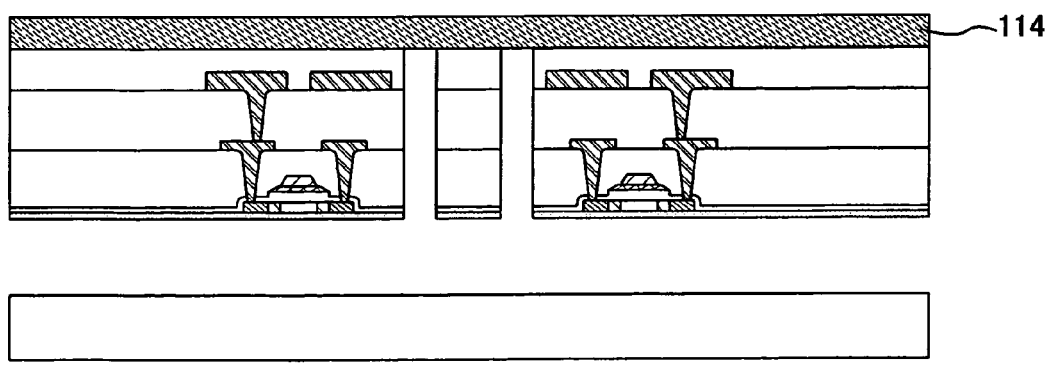

Then, the thin film integrated circuit 109 including the element group 106 and the conductive layer 110 is bonded to a backing 114 to peel the thin film integrated circuit 109 from the substrate 101 (FIG. 4D). At this time, the portion from which the peel layer 102 is removed is bonded to the backing 114 to be peeled completely from the substrate 101, and the portion where the peel layer remains is attached to the substrate 101.

As the backing 114, a flexible substrate made from plastic or the like, or a double-faced tape may be used. The flexible substrate may have an adhering surface made from an adhesive agent such as thermosetting resin. Further, the thin film integrated circuit 109 may be bonded to the surfaces of products without using the backing 114. In that case, the products that are mounted with the thin film integrated circuit 109 will have reduced thicknesses and weights.

The foregoing manufacturing method has one feature of removing partially the peel layer. According to the feature, the region where the peel layer remains is in a solid state even after removing partially the peel layer, and so the thin film integrated circuit 109 can be retained over the substrate 101, which leads to prevent the thin film integrated circuit 109 from scattering.

According to the present invention, the material body pattern is provided to the boundary between the thin film integrated circuits based on the thin film integrated circuit as a unit, and a part of the peel layer can be retained at the bottom of the material body pattern after partially removing the peel layer. Accordingly, only arbitrary thin film integrated circuit can be transferred to the backing. The process for transferring to the backing makes it possible to divide a plurality of the thin film integrated circuits into each piece because part of the peel layer is retained at the bottom of the material body pattern. Therefore, the process for dividing a plurality of the thin film integrated circuits can be eliminated.

This embodiment can be freely combined with Embodiment 1.

EMBODIMENT 3

An example of manufacturing equipment of a thin film integrated circuit is explained in this embodiment.

FIGS. 6A to 6E illustrate a delivery carrier 401, a first substrate carrying arm 400, an etching agent introducing chamber 405, an etching agent inlet 406, an etching agent outlet 407, a second substrate carrying arm 408, a belt conveyor 410, a film delivery roll 411, a taken-up roll 412, a film delivery roll 413, and an alignment device 414.

Figure 6:
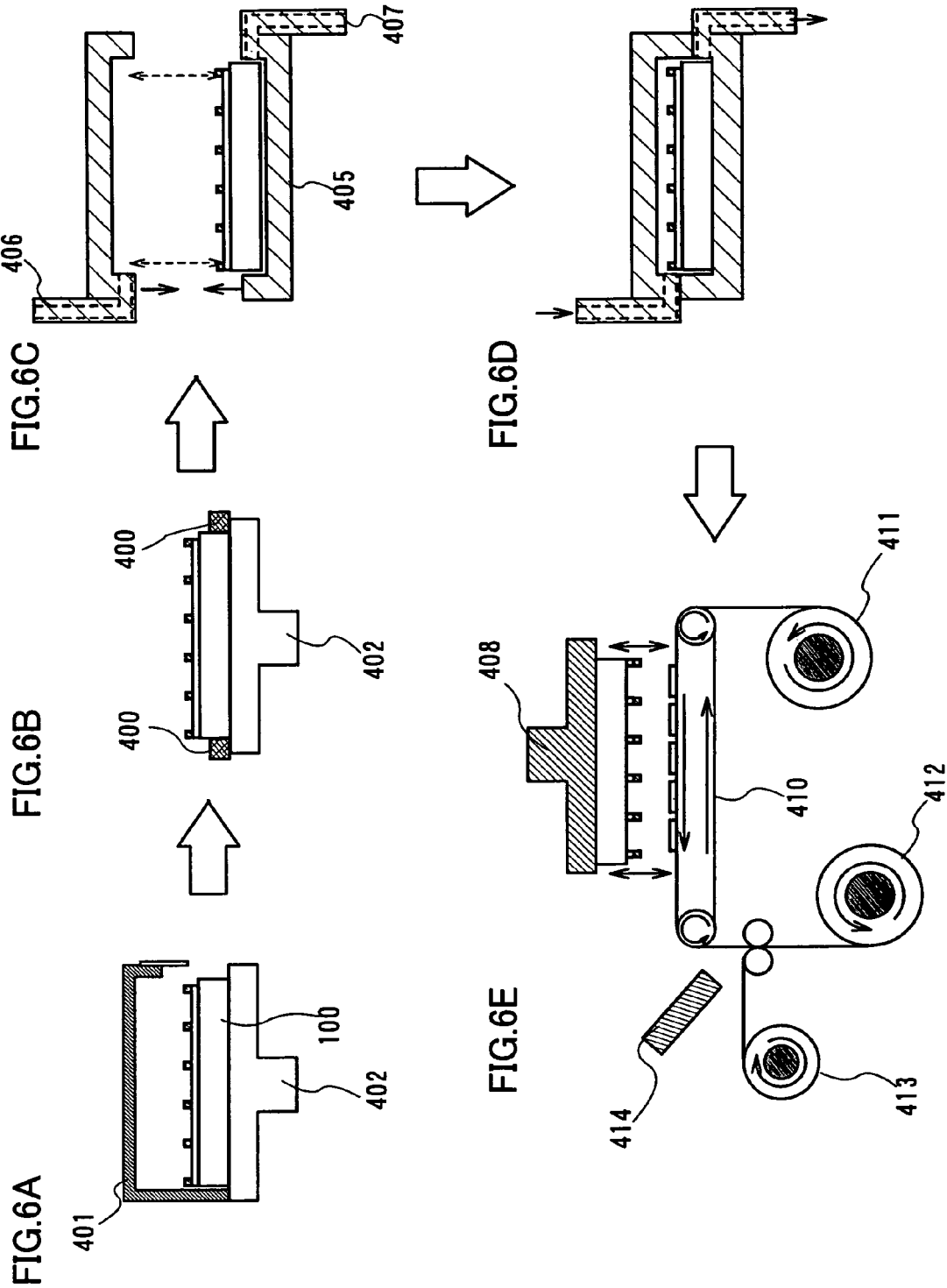
FIGS. 6A to 6E are views for showing manufacturing equipment for a thin film integrated circuit.

As illustrated in FIG. 6A, a layer including a thin film integrated circuit before removing a peel layer is transported by using a delivery elevator 402 from the delivery carrier 401. At this time, the layer including the thin film integrated circuits can be fixated, and a substrate can be moved without being scattered by virtue of the peel layer. The substrate at this stage is provided with multiple holes reaching the peel layer. Moreover, a material body is provided to the boundary between the thin film integrated circuits.

As illustrated in FIG. 6B, an insulating substrate 100 provided with the layer including the thin film integrated circuit is held between the first substrate carrying arm 400 to be lifted, and placed in the etching agent introducing chamber 405 shown in FIG. 6C. Alternatively, the thin film integrated circuit formed over the insulating substrate 100 is scooped up and put in the lower part of the chamber 405 from its edge. That is, as long as a means that can place the insulating substrate 100 in the chamber 405 is used, it is not limited to use the first substrate carrying arm 400.

In this state, an etching agent is introduced from the etching agent inlet 406 and exhausted from the etching agent outlet 407. The etching agent passes through multiple holes reaching the peel layer while being inhibited by the material body to remove partially the peel layer, that is, to remove the peel layer that is overlapped with the thin film integrated circuit, consequently, a void is formed.

After removing the part of the peel layer 102, the substrate is moved to the place shown in FIG. 6E by the second substrate carrying arm 408. The layer including the thin film integrated circuits can be fixated because of the peel layer that remains by virtue of the material body and the substrate can be moved without the thin film integrated circuits being scattered.

Thereafter, only the thin film integrated circuit can be transferred by pressing the substrate against the film that is composed of an extreme thin film pasted with the film that is provided with an adhesion surface and that is sent from the film delivery roll 411, for example, a Scotch tape, a Tackwell tape (extreme thin single-faced tape), a Double Tack tape (extreme thin double-faced tape). In that case, the film having an adhesion surface having higher adhesion strength than that of the region provided with the material body, that is, the region where the peel layer remains is used. Simultaneously, the thin film integrated circuits are divided into individual pieces. FIG. 6E illustrates the state after transferring the thin film integrated circuit. The portion provided with the material body is not transferred to be retained over the substrate.

An antenna may be provided to the film provided with an adhesion surface. In the case that the distances between the antennas and the distances between the thin film integrated circuits are different from each other, the antenna may be provided to an extensible film and the antennas and the thin film integrated circuits can be pasted with each other while pulling the film.

Thereafter, a film serving as a protective film (protective film), for example, a film for laminate processing, a Scotch tape, a Tackwell tape (extreme thin single-faced tape), a Double Tack tape (extreme thin double-faced tape), each of which is bonded to an extreme thin film is delivered from the film delivery roll 413. These films have preferably resistance to an etching gas and high heat resistance. The alignment of bonding is controlled by the alignment device 414, for example, a CCD camera, and the protective film is bonded to the thin film integrated circuit.

Lastly, the completed thin film integrated circuit is taken up by the taken-up roll 412.

Thereafter, the thin film integrated circuit is divided when it is mounted on a good. Accordingly, the thin film integrated circuit in the state of being taken up by the taken-up roll 412 can be moved or traded. As a result, extreme fine thin film integrated circuits of 5 mm square (25 mm$^2$) or less, preferably, 0.3 mm square (0.09 mm$^2$) to 4 mm square (16 mm$^2$) can be readily manufactured, moved, or traded without being scattered.

This embodiment can be freely combined with Embodiment 1 or 2.

EMBODIMENT 4

In this embodiment, a manufacturing device that is different from that described in Embodiment 3 is explained. Embodiment 3 illustrates an example of pressing a substrate with a second substrate carrying arm, whereas Embodiment 4 illustrates an example of using a roll for pressing the substrate.

Figure 7:
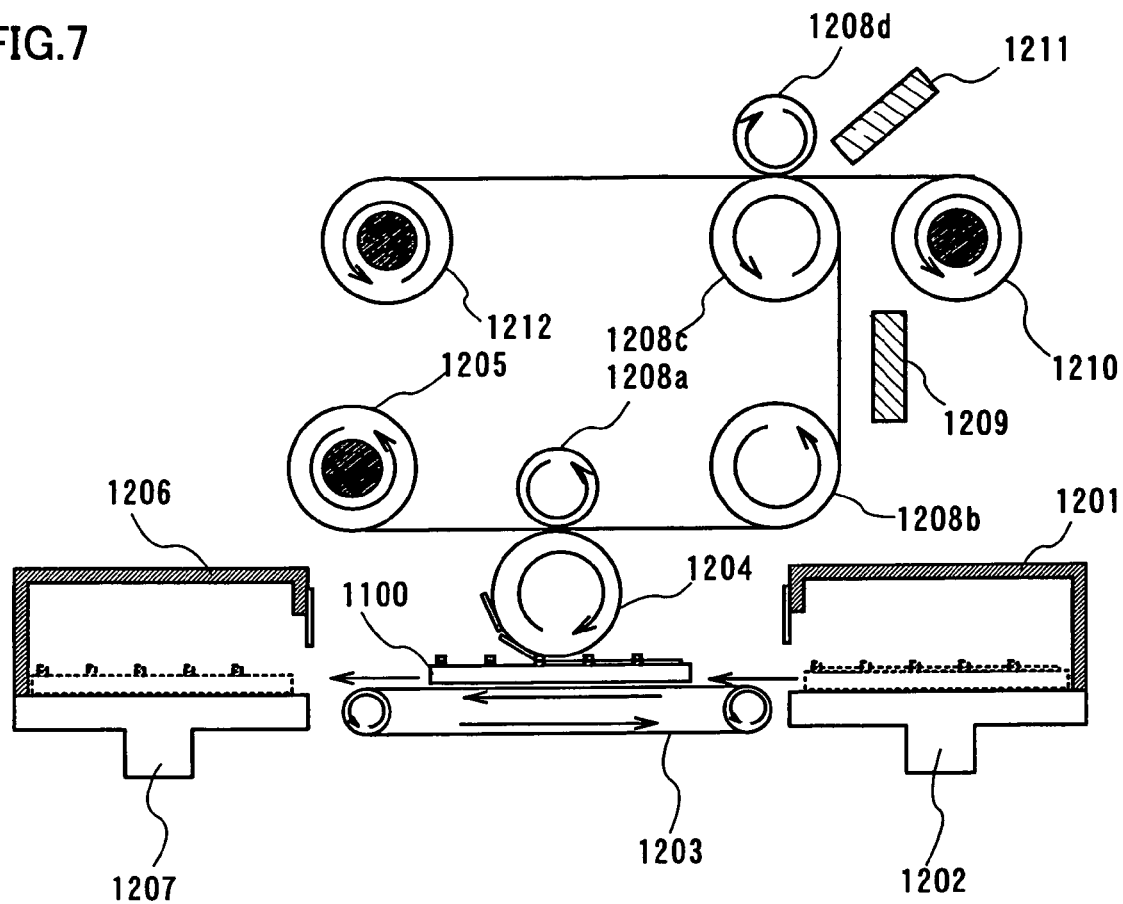
FIG. 7 is a view for showing manufacturing equipment for a thin film integrated circuit.

FIG. 7 illustrates a delivery carrier 1201, a delivery elevator 1202, a belt conveyor 1203, a transfer roller 1204, a film delivery roll 1205, a discharge carrier 1206, a discharge elevator 1207, rollers 1208a, 1208b, 1208c, and 1208d, an operation evaluation device 1209, a film delivery roll 1210, an alignment device 1211, and a take-up roll 1212. A thing provided with an adhesion surface for an upper surface of the thin film integrated circuit, that is, a so-called tape, is delivered from the film delivery roll 1205.

As illustrated in FIG. 7, a thin film integrated circuit in which a peel layer is selectively removed is transported from the delivery carrier 1201 to be placed over the belt conveyor 1203. The substrate transported by the belt conveyor 1203 is pressed against the transfer roller 1204 having an adhesion surface to transfer only the thin film integrated circuit. The transfer roller 1204 can be formed by silicon resin or fluoride resin, Specifically, silicon rubber, perfluoroelastomer, Fluon Aflas, PTFE (TEFLON®) rubber, and the like can be used. Especially, the perfluoroelastomer and the Fluon Aflas have high heat resistance and high chemical resistance, and so they are preferably used.

The delivery roller 1204 is made to have higher adhesion strength than that of a region provided with the material body, that is, a region where the peel layer remains. Then, only the thin film integrated circuit is transferred from the substrate and a substrate 1100 is moved by the belt conveyor 1203.

Thereafter, a film having an adhesion surface, for example, a Scotch tape, a Tackwell tape (extreme thin single-faced tape), a Double Tack tape (extreme thin double-faced tape), each of which is-bonded to an extreme thin film, or the like is delivered from the film delivery roll 1205. These films have preferably resistance to an etching gas and high heat resistance. Then, the film provided with an adhesion surface can be bonded to the transferred thin film integrated circuit by the roller 1208a.

An antenna may be provided to the film having an adhesion surface. In this instance, an alignment device is preferably provided to the vicinity of the roller 1208a. In the case that the distances between the antennas and the distances between the thin film integrated circuits are different from each other, the antenna may be provided to an extensible film and the antennas and the thin film integrated circuits can be pasted with each other while pulling the film.

The thin film integrated circuit pasted with the film passes through the operation evaluation device 1209 by the roller 1208b or the like. At this moment, the operation of the thin film transistor can be confirmed. For instance, when the thin film integrated circuit mounted with the antenna is transported, a predetermined signal is recorded by using a reader/writer as the operation evaluation device, and the operation can be confirmed from the fact whether the thin film integrated circuit returns the signal or not.

Since approximately 672000 pieces of ID tags of 1 mm square can be manufactured in the case of manufacturing the thin film integrated circuit by using a glass substrate of 7300× 9200 mm$^2$, the confirmation of operation for randomly selected thin film integrated circuits is carried out.

Thereafter, a film serving as a protective film (protective film), for example, a film for laminate processing, a Scotch tape, a Tackwell tape (extreme thin single-faced tape), a Double Tack tape (extreme thin double-faced tape), each of which is bonded to an extreme thin film, or the like is delivered from the film delivery roll 1210. These films have preferably resistance to an etching gas and high heat resistance. The alignment of bonding is controlled by the alignment device 1211, for example, a CCD camera, the protective film is bonded to the thin film integrated circuit.

Lastly, the completed thin film integrated circuit is taken up by the taken-up roll 1212.

Thereafter, the thin film integrated circuit is divided into individual pieces when it is mounted on a good. Accordingly, the thin film integrated circuit in the state of being taken up by the taken-up roll 1212 can be transported or traded. As a result, extreme fine thin film integrated circuits of 5 mm square (25 mm$^2$) or less, preferably, 0.3 mm square (0.09 mm$^2$) to 4 mm square (16 mm$^2$) can be readily manufactured, transported, or traded without being dispersed.

This embodiment can be freely combined to any one of Embodiments 1 to 3.

EMBODIMENT 5

A thin film integrated circuit manufactured according to the present invention has a plurality of elements and a conductive layer serving as an antenna. The plurality of elements represents a thin film transistor, a capacitor element, a resistance element, a diode, and the like.

Figure 8:
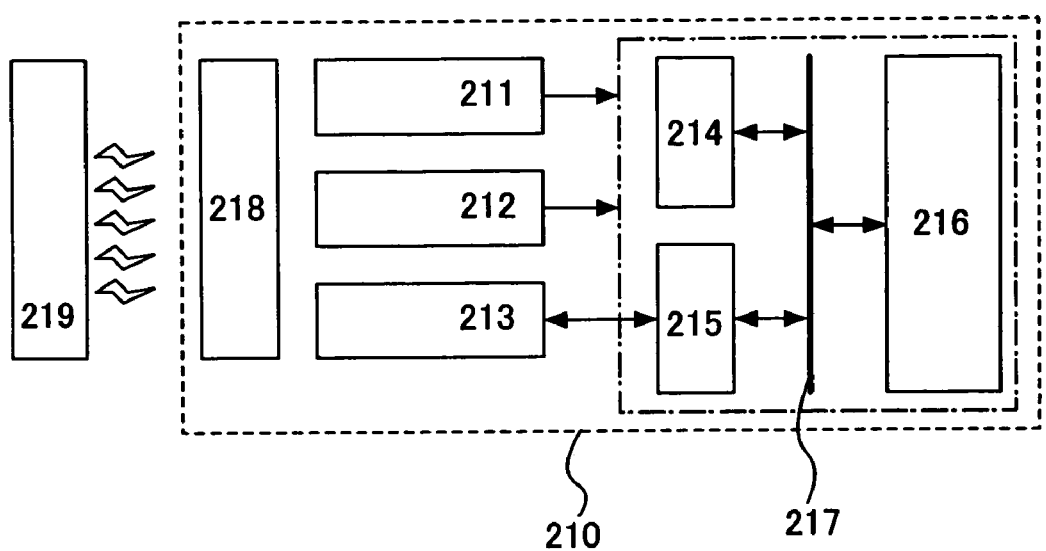
FIG. 8 is an explanatory view for a thin film integrated circuit.

A thin film integrated circuit 210 has a function of transmitting and receiving data wirelessly. A plurality of elements included in the thin film integrated circuit 210 constructs various circuits. For example, a power source circuit 211, a clock generation circuit 212, a data demodulation/modulation circuit 213, a control circuit 214, an interface circuit 216, a memory 216, a data bus 217, antenna (also referred to as antenna coil) 218, and the like are included in the thin film integrated circuit 210 (FIG. 8).

The power source circuit 211 is a circuit that generates various power sources to be supplied to the foregoing each circuit based on an alternating current signal inputted from the antenna 218. The clock generation circuit 212 is a circuit that generates various clocks to be supplied to the foregoing each circuit based on the alternating current signal inputted from the antenna 218. The data demodulation/modulation circuit 213 has a function of demodulating/modulating data for being transmitted or received from/to a reader/writer 219. The control circuit 214 is equivalent to a central processing unit (CPU), a microprocessor (MPU), or the like, and has a function of controlling another circuit. The antenna 218 has a function of sending and receiving an electromagnetic field or an electric wave. The reader/writer 219 communicates with the thin film integrated circuit, controls the thin film integrated circuit, and controls the processing relating to the data.

The circuits constructed by the thin film integrated circuit is not limited to the foregoing structures, for example, the circuits may have a structure that is added with another component part such as a limiter circuit of power source voltage or hardware for encryption processing use.

This embodiment can be freely combined with any one of Embodiments 1 to 4.

EMBODIMENT 6

The usage of a thin film integrated circuit manufactured according to the present invention is wide-ranging. For example, the thin film integrated circuit can be used by providing to paper money, coins, securities, bearer bonds, certificates (driver's license, residence certificate, and the like appearing in FIG. 9A), packing containers (wrapping paper, a bottle, and the like appearing in FIG. 9B), a recording medium (DVD software, a video tape, and the like appearing in FIG. 9C), vehicles (a bicycle, and the like appearing in FIG. 9D), commodities (a bag, glasses, and the like appearing in FIG. 9E), foods, garments, livingware, electronic appliances, and the like. The electronic appliances represent a liquid crystal display device, an EL display device, a television device (also referred to as TV, TV receiver, or television receiver), a cellular phone, and the like.

Figure 9A:
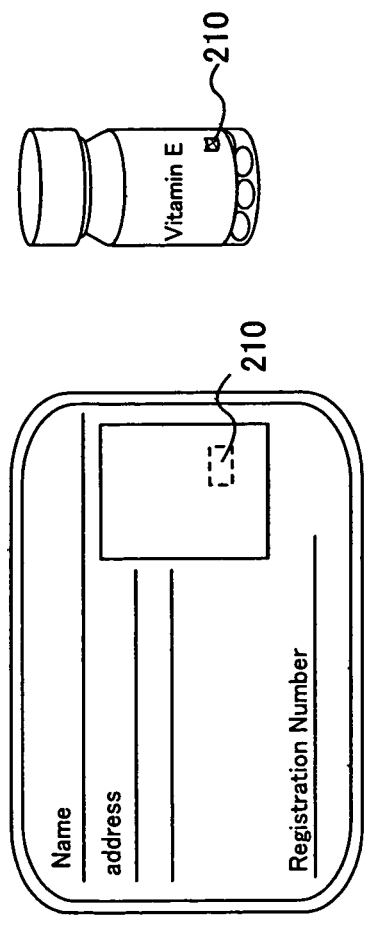
FIGS. 9A to 9E are explanatory views for a type of usage of a thin film integrated circuit.
Figure 9B:
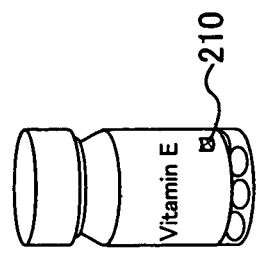
Figure 9C:
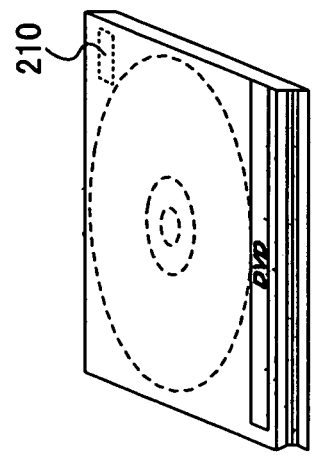
Figure 9D:
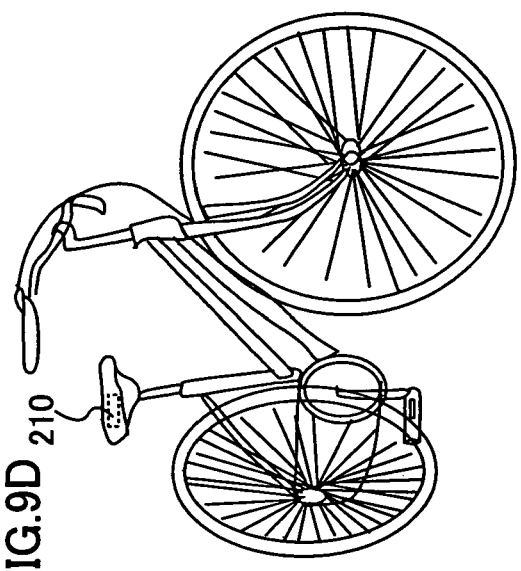
Figure 9E:
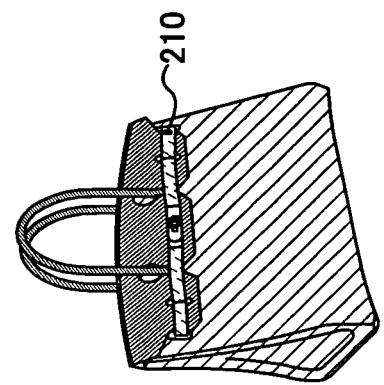

Since the thin film integrated circuit can be reduced its thickness drastically according to the present invention, it is advantageous that a photograph for the certificates (driver's license, residence certificate, and the like appearing in FIG. 9A) can be stacked over a thin film integrated circuit 210.

The thin film integrated circuit is fixated to products by pasting over the surface of the products or embedding in the products. For example, the thin film integrated circuit is embedded in a paper of a book, or in organic resin of a package made from the organic resin. A counterfeit can be prevented by providing the thin film integrated circuit to the paper money, the coins, the securities, the bearer bonds, the certificates, and the like. The efficiency in an inspection system or a system used in a rental shop can be promoted by providing the thin film integrated circuit to the packing containers, the recording medium, the commodities, the foods, the garment, the livingware, the electronic appliances, and the like. A counterfeit or theft can be prevented by providing the thin film integrated circuit to the vehicles.

Figure 10B:
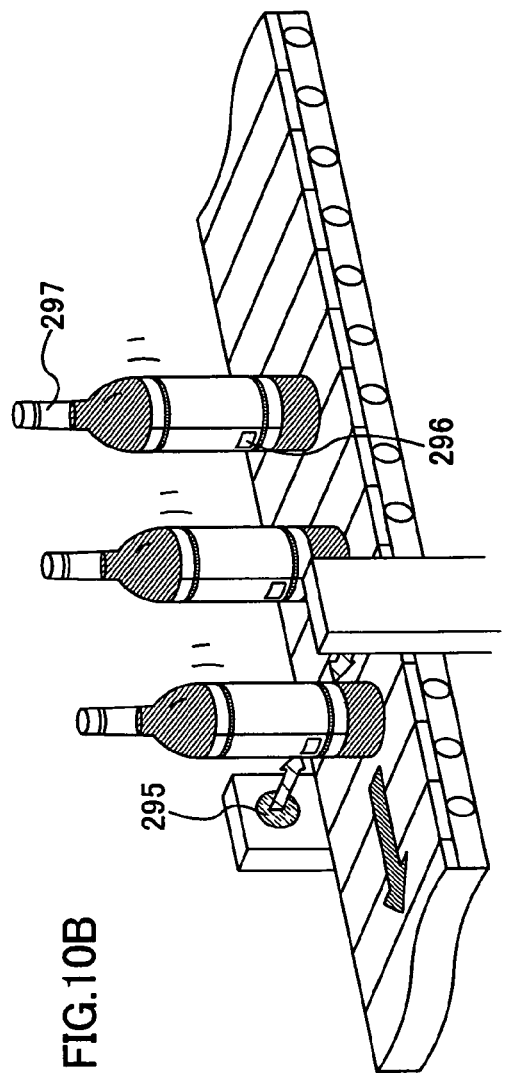
FIGS. 10A and 10B are explanatory views for a type of usage of a thin film integrated circuit.
Figure 10A:
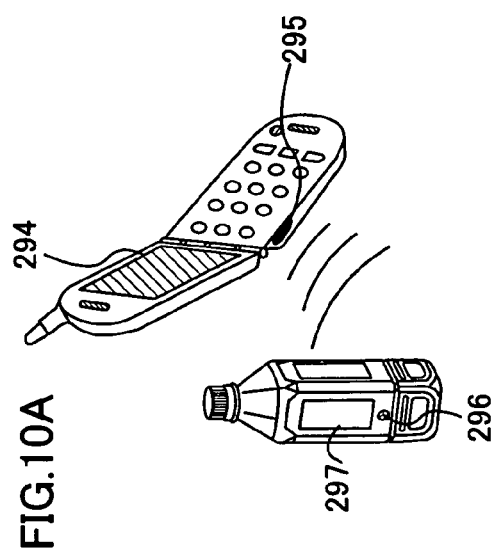

By applying the thin film integrated circuit for a system for logistics or distribution, the system becomes increasingly sophisticated. For example, there is the case that a reader/writer 295 is provided to the side face of a portable terminal having a display portion 294 and a thin film integrated circuit 296 is provided to the side face of a product 297 (FIG. 10A). In that case, information on the raw material, the place of origin, distribution process, and the like of the product 297 can be displayed on the display portion 294 when the reader/writer 295 is held over the thin film integrated circuit 296. Alternatively, there is the case that the reader/writer 295 is provided to the side of a belt conveyor (FIG. 10B). In that case, goods inspection can be carried out easily.

This embodiment can be freely combined with any one of Embodiments 1 to 5.

EMBODIMENT 7

In this embodiment, an example of forming a semiconductor element by release treatment and a transferring process while exposing an antenna is explained with reference to FIG. 11. This description is the same as that given in Embodiment 1 except that a second insulating film is not formed and will be explained in no more details.

A peel layer is formed over a substrate having an insulating surface. The peel layer is formed by forming a layer containing silicon by a known method such as a sputtering method or a plasma CVD method.

Then, an insulating film 312a made of an inorganic insulating film is formed. And then, a layer including a semiconductor element 312b is formed using the insulating film 312a as a base film. Lastly, an antenna 314 is formed by a material containing aluminum as its main components. Since the antenna 314 can resist trifluoride chlorine ($ClF_3$), an insulating film is not required to be formed thereover. Not providing the insulating film can make it easier for signals to be transmitted and received.

An element group 313a includes a plurality of TFTs except in the portion where the antenna 314 is formed. Lastly, one device can be formed by the element group 313a and the antenna connected to the TFTs.

An etching process with a mask is carried out. By the etching process, an opening portion reaching a peel layer is selectively formed except in a region where the TFTs or the antenna 314 are provided to expose a part of the peel layer.

Then, a material body is formed by a screen printing method or a droplet discharging method.

An etching agent for removing the peel layer is introduced to the opening portion to remove partially the peel layer. Accordingly, the peel layer in a region overlapped with the material body remains.

The first element group 313a is thermocompressed to a laminate film formed by a first adhesive synthetic resin film 318 and a first backing film 317 by a laminate method to peel the first element group 313a from the substrate. Here, a laminate film (with a total thickness of 30 μm) formed by stacking polyethylene (10 μm) and a polyethylene film (20 μm) is used as the laminate film.

A sealing process is carried out by thermocompressing (at approximately 100° C.) the first element group 313a to a laminate film formed by a second adhesive synthetic resin film 319 and a second backing film 320 by a laminate method. Here, a laminate film (with a total thickness of 30 μm) formed by polyethylene (10 μm) and a polyethylene film (20 μm) is also used.

Figure 11:
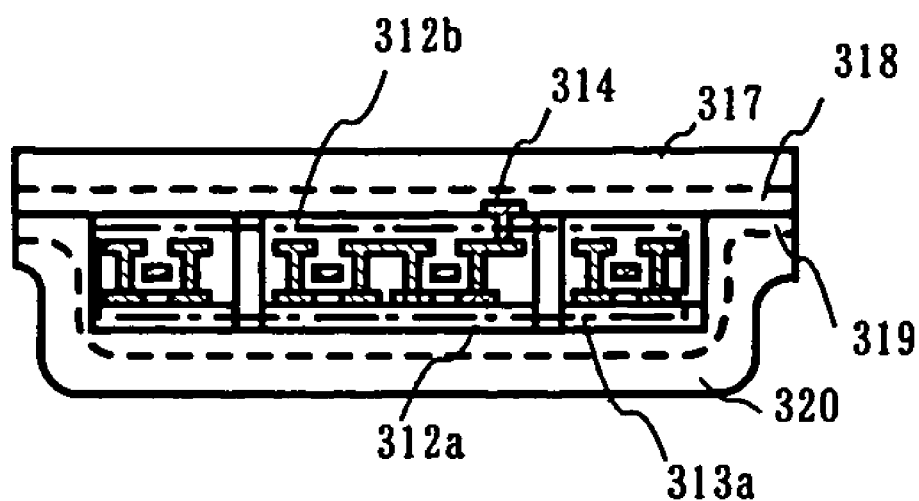
FIG. 11 is an explanatory cross-sectional view for a thin film integrated circuit according to the present invention.

Lastly, the semiconductor device is divided into the individual pieces as shown in FIG. 11. The laminate film is directly contacted with the antenna. Another material layer is not interposed between the laminate film and the antenna. Consequently, a semiconductor device having an extremely thin thickness (with a total thickness given by the thickness of the first element group (3 μm or less)+60 μm) sandwiched between two laminate films (30 μm).

This embodiment can be freely combined with any one of Embodiments 1 to 5.

According to the present invention, a method for manufacturing a matrix type (multiple patterned type) that is divided into individual pieces as a product in which small multiple electronic component elements are mounted over a glass substrate having the size of 600×720 mm, 680×880 mm, 1000×1200 mm, 1100×1250 mm, 1150×1300 mm, or more can be realized.

This application is based on Japanese Patent Application serial no. 2004-192117 filed in Japan Patent Office on 29th Jun., 2004, the contents of which are incorporated by reference.

Although the present invention has been fully described by way of examples with reference to the accompanying drawings, it is to be understood that various changes and modifications will be apparent to those skilled in the art. Therefore, unless otherwise such changes and modifications depart from the scope of the present invention hereinafter described, they should be construed as being included therein.

What is claimed is:

1. A method for manufacturing a semiconductor device comprising the steps of:
    forming a peel layer over a substrate having an insulating surface;
    forming a layer including at least first, second, and third portions over the peel layer, the third portion being interposed between the first portion and the second portion;
    forming first and second openings reaching the peel layer in each of the first and second portions;
    forming a material body over the third portion interposed between the first portion and the second portion;
    introducing an etching material in the first and second openings;
    selectively removing the peel layer by the etching material wherein
        a portion of the peel layer remains without being etched, and the material body and the third portion overlap said portion, and
        at least one of the first portion and the second portion does not overlap with any remaining portion of the peel layer; and
    separating the first portion and the second portion from the substrate having the insulating surface and the material body.

2. The method for manufacturing the semiconductor device according to claim 1, wherein the first and second portions each have at least one semiconductor element.

3. The method for manufacturing the semiconductor device according to claim 1, wherein said etching material is gas or liquid containing fluorine halide.

4. The method for manufacturing the semiconductor device according to claim 1, wherein the openings are a plurality of holes.

5. The method for manufacturing the semiconductor device according to claim 1, wherein the first and second openings are a plurality of grooves.

6. A method for manufacturing a semiconductor device comprising the steps of:
    forming a peel layer over a substrate having an insulating surface;
    forming a layer including at least first and second thin film integrated circuits over the peel layer;
    forming first and second openings reaching the peel layer in each of the first and second thin film integrated circuits;
    forming a material body over at least a part of a boundary between the first thin film integrated circuit and the second thin film integrated circuit;
    introducing an etching material in the first and second openings;
    selectively removing the peel layer by the etching material wherein
        a portion of the peel layer remains without being etched, and the material body overlaps said portion, and
        at least one of the first thin film integrated circuit and the second thin film integrated circuit does not overlap with any remaining portion of the peel layer; and
    separating the first thin film integrated circuit and the second thin film integrated circuit from the substrate having the insulating surface and the material body.

7. The method for manufacturing the semiconductor device according to claim 6, wherein a top surface shape of the material body is a linear shape parallel to one side of the substrate or a lattice shape surrounding the first and second thin film integrated circuits.

8. The method for manufacturing the semiconductor device according to claim 6, wherein the material body is obtained by a screen printing method or a droplet discharging method.

9. The method for manufacturing the semiconductor device according to claim 6, wherein the material body is a material that does not chemically react with the etching material.

10. The method for manufacturing the semiconductor device according to claim 6, wherein said etching material is gas or liquid containing fluorine halide.

11. The method for manufacturing the semiconductor device according to claim 6, wherein the first and second openings are a plurality of holes.

12. The method for manufacturing the semiconductor device according to claim 6, wherein the first and second openings are a plurality of grooves.

13. A method for manufacturing a semiconductor device comprising the steps of:
    forming a peel layer over a substrate having an insulating surface;
    forming a layer including at least first and second thin film integrated circuits over the peel layer;
    forming first and second openings reaching the peel layer in each of the first and second thin film integrated circuits;
    forming a material body over at least a part of a boundary between the first thin film integrated circuit and the second thin film integrated circuit;
    introducing an etching material in the first and second openings;
    selectively removing the peel layer by the etching material wherein
        a portion of the peel layer remains without being etched, and the material body overlaps said portion, and
        at least one of the first thin film integrated circuit and the second thin film integrated circuit does not overlap with any remaining portion of the peel layer;
    transferring the first and second thin film integrated circuits to a backing having an adhesion surface; and
    dividing the first and second thin film integrated circuits into individual pieces or individual groups.

14. The method for manufacturing the semiconductor device according to claim 13, wherein a top surface shape of the material body is a linear shape parallel to one side of the substrate or a lattice shape surrounding the first and second thin film integrated circuits.

15. The method for manufacturing the semiconductor device according to claim 13, wherein the material body is obtained by a screen printing method or a droplet discharging method.

16. The method for manufacturing the semiconductor device according to claim 13, wherein the material body is a material that does not chemically react with the etching material.

17. The method for manufacturing the semiconductor device according to claim 13, wherein said etching material is gas or liquid containing fluorine halide.

18. The method for manufacturing the semiconductor device according to claim 13, wherein the first and second openings are a plurality of holes.

19. The method for manufacturing the semiconductor device according to claim 13, wherein the first and second openings are a plurality of grooves.

* * * * *